(12) United States Patent
Buff et al.

(10) Patent No.: US 9,972,475 B2
(45) Date of Patent: May 15, 2018

(54) APPARATUS AND METHOD TO CONTROL AN ION BEAM

(71) Applicant: Varian Semiconductor Equipment Associates, Inc., Gloucester, MA (US)

(72) Inventors: James S. Buff, Brookline, NH (US); Edward W. Bell, Newbury, MA (US); W. Davis Lee, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days. days.

(21) Appl. No.: 14/572,016

(22) Filed: Dec. 16, 2014

(65) Prior Publication Data

US 2016/0172159 A1   Jun. 16, 2016

(51) Int. Cl.
| | |
|---|---|
| *H01J 37/244* | (2006.01) |
| *H01J 37/317* | (2006.01) |
| *H01J 37/04* | (2006.01) |
| *H01J 37/304* | (2006.01) |

(52) U.S. Cl.
CPC .......... *H01J 37/3171* (2013.01); *H01J 37/04* (2013.01); *H01J 37/304* (2013.01)

(58) Field of Classification Search
None
See application file for complete search history.

(56) References Cited

U.S. PATENT DOCUMENTS

| | | | | |
|---|---|---|---|---|
| 6,323,497 B1 * | 11/2001 | Walther | ................. | H01J 37/304 250/492.1 |
| 6,933,507 B2 * | 8/2005 | Purser | ..................... | H01J 37/14 250/396 ML |
| 8,604,443 B2 * | 12/2013 | Sinclair | ................. | H01J 37/153 250/396 ML |
| 9,275,819 B2 * | 3/2016 | Hahto | .................... | H01J 27/205 |
| 2007/0170369 A1 * | 7/2007 | Purser | .................... | H01J 37/147 250/396 ML |
| 2011/0001059 A1 * | 1/2011 | Ray | ...................... | H01J 37/1472 250/400 |
| 2011/0114850 A1 * | 5/2011 | Purser | .................... | G21K 1/093 250/396 R |
| 2014/0212595 A1 * | 7/2014 | Bai | ......................... | C23C 14/48 427/523 |
| 2014/0265856 A1 * | 9/2014 | Hahto | .................... | H01J 27/022 315/111.41 |
| 2015/0270099 A1 * | 9/2015 | Olson | ................. | H01J 37/3007 250/396 R |

OTHER PUBLICATIONS

International Search Report and Written Opinion dated Mar. 18, 2016, in corresponding PCT/US2015/063328.

* cited by examiner

*Primary Examiner* — Andrew Smyth

(57) ABSTRACT

An apparatus to control a ribbon ion beam. The apparatus may include a coil assembly comprising a plurality of electromagnetic coils configured to generate a magnetic field proximate the ribbon beam, the magnetic field extending in a first direction that forms a non-zero angle with respect to a direction of propagation of the ribbon ion beam; a current source assembly configured to supply current to the coil assembly; and a controller configured to control the current source assembly to send at least one dithering current signal to the coil assembly responsive to a beam current measurement of the ribbon ion beam, wherein the at least one dithering current signal generates a fluctuation in magnetic field strength of the magnetic field.

17 Claims, 5 Drawing Sheets

APPARATUS AND METHOD TO CONTROL AN ION BEAM

FIELD

The present embodiments relate to ion beam apparatus, and more particularly, to components and methods to control ion beams in beamline ion implanters.

BACKGROUND

In the present day, ion implanters are often constructed to optimize implantation according to a specific set of applications. In current applications, for example, some beamline ion implanters are configured to generate high current ribbon beams in which the beam cross section that intercepts a substrate is defined by a beam width that is much greater than the beam height.

In the present day it is common to perform ion implantation using ribbon beams in an ion implanter that is dedicated to ribbon beam implantation, where a ribbon beam is directed to the substrate having a beam width sufficient to cover an entire substrate along a first direction of the substrate. The ribbon beam may have a much smaller height than width, where the ribbon beam height along a second direction perpendicular to the first direction is smaller than a substrate dimension along the second direction. In this manner, just a portion of a circular or rectangular substrate is exposed to the ribbon beam at one instance. Consequently, the entire substrate may be exposed to the ribbon beam by scanning the substrate with respect to the ribbon beam along the second direction.

However, if the ribbon beam exhibits non-uniformities in current density, for example, these non-uniformities may be reflected in non-uniform dose that is received by the substrate. For example, small fluctuation in current density may occur locally within portions of a ribbon beam during an ion implantation process, which may result in areas of higher or lower implant dose within a substrate that is exposed to the ribbon beam. It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment an apparatus to control a ribbon ion beam may include a coil assembly comprising a plurality of electromagnetic coils configured to generate a magnetic field proximate the ribbon beam, the magnetic field extending in a first direction that forms a non-zero angle with respect to a direction of propagation of the ribbon ion beam; a current source assembly configured to supply current to the coil assembly; and a controller configured to control the current source assembly to send at least one dithering current signal to the coil assembly responsive to a beam current measurement of the ribbon ion beam, wherein the at least one dithering current signal generates a fluctuation in magnetic field strength of the magnetic field.

In another embodiment, an ion implanter may include an ion source to generate a ribbon ion beam; a beam monitor to perform a beam current measurement of the ribbon ion beam at a first position; a coil assembly comprising a multiplicity of coils configured to generate a magnetic field proximate the ribbon beam at a second position, the magnetic field extending in a first direction that that forms a non-zero angle with respect to a direction of propagation of the ribbon ion beam at the second position; and a current source assembly configured to supply a dithering current to the coil assembly; and a controller configured to control the current source assembly to send at least one dithering current signal to the coil assembly responsive to the beam current measurement, wherein the dithering current generates a fluctuation in magnetic field strength of the magnetic field.

In a further embodiment a method for controlling a ribbon ion beam may include measuring a beam current profile of the ribbon ion beam at a first position, the beam current profile comprising beam current density as a function of position along at least one direction that is perpendicular to a direction of propagation of the ribbon ion beam; determining a non-uniformity in the ribbon ion beam based upon the beam current profile; and sending a control signal to dither current within at least one electromagnetic coil of a coil assembly comprising plurality of electromagnetic coils, the coil assembly being disposed around the ribbon beam at a second position, and configured to generate a magnetic field extending in a first direction that forms a non-zero angle with respect to a direction of propagation of the ribbon ion beam at the second position, wherein the at least one electromagnetic coil generates a fluctuating magnetic field that causes a time-dependent variation in beam current density in the ribbon ion beam.

DETAILED DESCRIPTION

Figure 1:
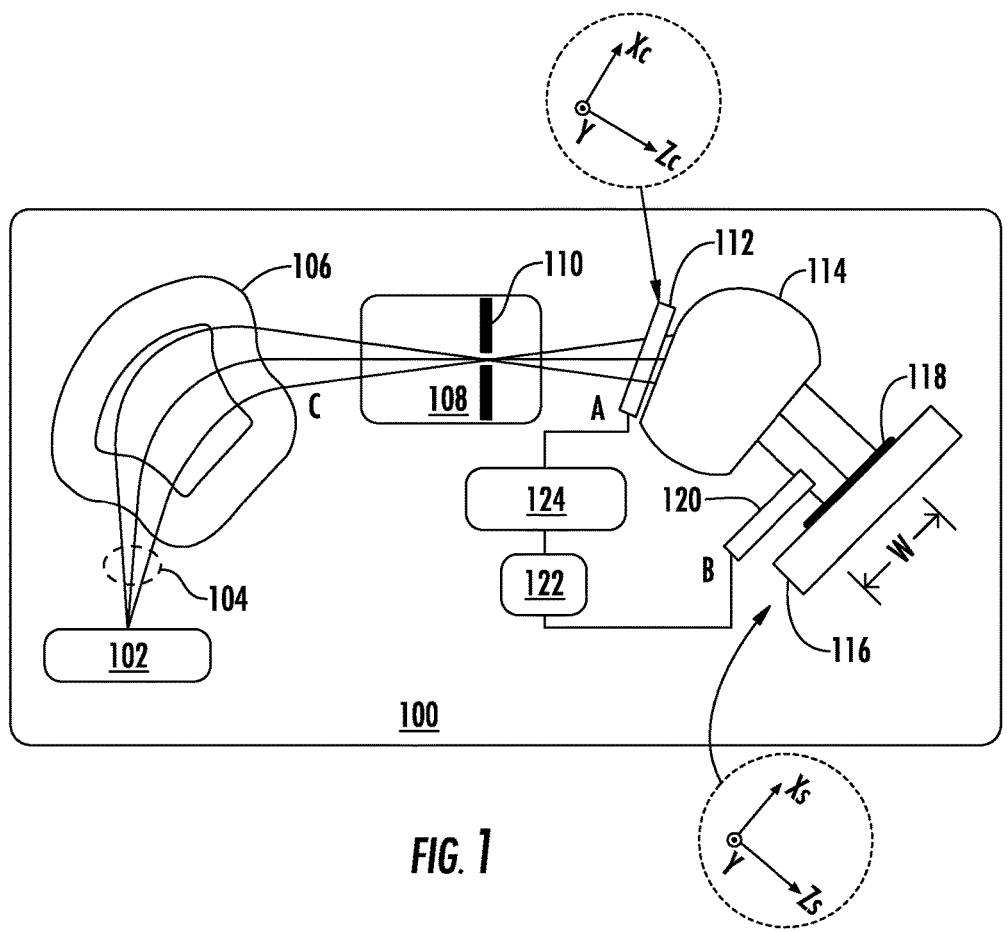
FIG. 1 depicts a top plan view in block form of a ion implanter according to various embodiments.

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

The embodiments described herein provide novel ion implanters, and novel apparatus and methods to control an ion beam in an ion implanter. In various embodiments a multi-coil assembly is provided in a beamline ion implanter to dither an ion beam while the ion beam is directed to a substrate. The dithering may provide various advantages, including improvements in beam current dose uniformity or reduction in beam current dose variation at a substrate as well as providing control of angular spread of ion trajectories within an ion beam, and control of beam size. In particular a multi-coil assembly may be arranged at a target location in a beamline ion implanter to dither a ribbon ion beam to improve beam properties. The multi-coil assembly may include a plurality of electromagnetic coils that are capable of being driven independently of one another, that is, an electromagnetic coil of the multi-coil assembly is capable of receiving current independently of other electromagnetic coils of the multi-coil assembly. The multi-coil assembly of the present embodiments is arranged proximate to an ion beam in order to locally alter a magnetic field in order to affect the ion beam in a targeted manner.

In various embodiments current may be supplied to the multi-coil assembly by a current source assembly that may include multiple independent current sources. In some embodiments, a given current source is dedicated to provide current to one electromagnetic coil, or to a pair of electromagnetic coils. However, the embodiments are not limited in this context. In the present embodiments, a controller is provided to control the current source assembly to send a dithering signal(s) to the coil assembly. The dithering signal manifests as changing current through an electromagnetic coil as a function of time, which causes a fluctuation of the magnetic field proximate the ion beam that may affect the ion beam in a targeted manner.

As detailed below, further embodiments provide the advantage of tailoring dithering of an ion beam according to a targeted effect on the ion beam, which may include providing a uniform dithering signal that generates sweeping the ion beam as a whole with a time varying dipole field, or individually dithering electromagnetic coils where any combination of dither current amplitude (dither amplitude), frequency, or phase, may vary among different electromagnetic coils. In particular embodiments, a controller is coupled to a beam monitor that may perform beam current measurements on an ion beam. The controller may receive a beam current measurement from the beam monitor and may send at least one dithering current signal to the coil assembly that is responsive to the beam current measurement. In this manner, the ion beam may be adjusted in real-time by dithering a magnetic field that affects the ion beam to correct for a detected beam non-uniformity or other beam property.

FIG. 1 depicts a top plan view in block form of an ion implanter 100 that includes an ion source 102 that is configured to generate an ion beam 104. The ion beam 104 may be provided as a ribbon beam having a cross-section whose beam width at the substrate 118 is substantially greater than the beam height. The ion beam 104 may travel through an analyzer magnet 106, vacuum chamber 108, which may house a mass resolving slit 110, and through a collimator 114 before impacting a substrate 118 that is disposed on substrate stage 116. The substrate stage 116 may be configured to scan the substrate 118 and to vary the substrate scan rate in some embodiments. Other beamline components may be omitted as will be apparent to those of ordinary skill in the art. The ion implanter further includes a coil assembly 112 that includes a plurality of electromagnetic coils as discussed below. The coil assembly 112 may provide a magnetic field that affects the ion beam 104, and in particular may provide a dithering magnetic field that fluctuates according to a dithering current signal(s) provided to the coil assembly 112.

For convenience in the discussion to follow, different coordinate systems are employed to describe operation of the present embodiments as shown in FIG. 1. At the coil assembly 112 a first Cartesian coordinate system whose components are labeled Y, Xc, and Zc, is used. At the substrate 118 a second Cartesian coordinate system whose components are labeled Y, Xs, and Zs, is used. In each coordinate system, the Y-axis is the same absolute direction. The Z-axis for the different coordinate systems is in each case along the direction of central ray trajectory propagation of an ion beam at a particular point. This direction is also referred to as the "direction of propagation" of the ion beam or ribbon ion beam, though it will be understood that the trajectories (direction of propagation) of ions may vary within an ion beam at any given point. Thus, in the example of FIG. 1, the absolute direction of the Zc axis differs from that of Zs. Similarly Xc differs from Xs.

When the ion beam 104 is delivered to the substrate 118, for many applications it may be desirable that the ion beam 104 has a uniform beam current density throughout its cross-section, that is, within the Xs-Y plane. It may also be desirable that the size of the cross-section of the ion beam 104, such as the height or width of the cross-section of the ion beam 104 be accurately controlled. I may further be desirable to control the trajectories of ions. For example, it may be desirable to limit the angular spread of ion trajectories of ions within the ion beam 104 when those ions impact the substrate 118. Accordingly, the ion implanter 100 is provided with a current source assembly 124 that may provide a dithering current signal or group of dithering current signals to the coil assembly 112, in order to adjust beam current density, angular spread of ions, and beam size in either width or height, to name specific characteristics. The ion implanter 100 additionally includes a controller 122 that is configured to control the current source assembly 124 to send the dithering signals to the appropriate electromagnetic coil(s) of the coil assembly 112.

As further illustrated in FIG. 1, the controller 122 may be coupled to a beam monitor 120, which is configured to measure beam current of the ion beam 104. The beam monitor 120 may be configured according to known ion beam probes to provide beam current as a function of position within the Xs-Y plane. This beam current information may provide an indication of beam current uniformity or beam current variation across the cross-section of the ion beam 104. If performed upon more than one occasion, such as continuously, periodically, or intermittently, multiple beam current measurements may also provide information regarding fluctuations in the ion beam 104. This information may be received by controller 122, and may be employed to schedule the appropriate dither current signals to be delivered to the coil assembly 112, which in turn results in a dithering of the ion beam 104.

Although FIG. 1 depicts an embodiment of the ion implanter 100 in which the coil assembly is disposed at point A adjacent to the collimator 114, in other embodiments the coil assembly 112 may be arranged at any convenient position within the beamline such as at point C, or near point B. Similarly, the beam monitor 120 may be arranged adjacent to the substrate stage 116 at point B, but may alternatively be arranged at other locations within the beamline, such as at point A or point C. The embodiments are not limited in this context.

Figure 2A:
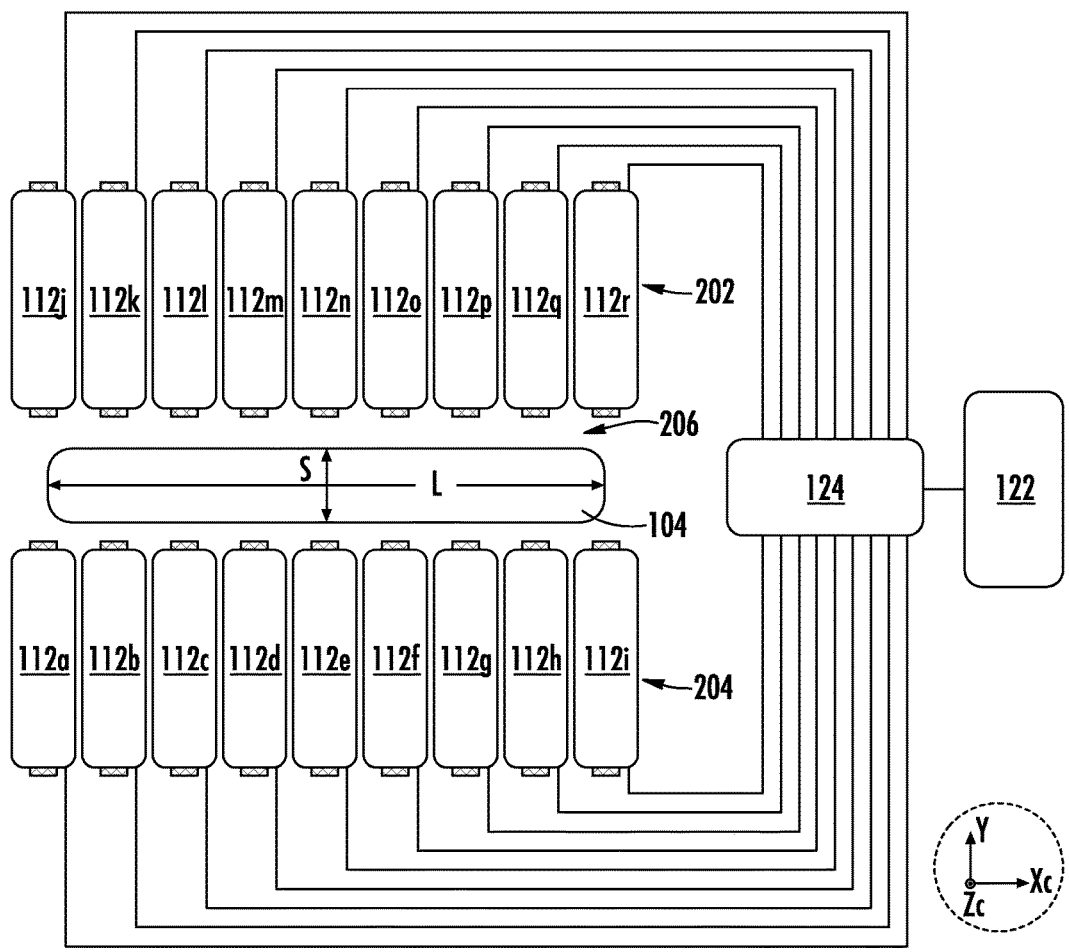
FIG. 2A depicts an end view of an exemplary apparatus to control a ribbon beam.
Figure 2B:
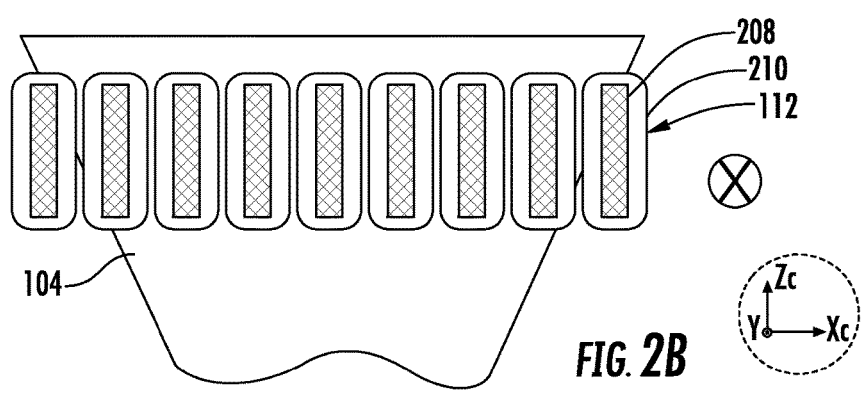
FIG. 2B depicts a top view of the apparatus of FIG. 2A.

Turning now to FIG. 2A, there is shown a composite illustration that includes an end view of an exemplary variant of the coil assembly 112, current source assembly 124, and controller 122. FIG. 2B depicts a top view of the coil assembly 112 of FIG. 2A. It may be appreciated that the current source assembly 124 and controller 122 are merely depicted in block form, and may be disposed more remotely from the coil assembly than suggested in FIG. 2A. In the variant of FIG. 2A the coil assembly 112 includes 18 different electromagnetic coils, labeled as electromagnetic coil 112a to electromagnetic coil 112r, which are arranged in two linear arrays composed of 9 electromagnetic coils each. These are shown as upper coil assembly 202 and lower coil assembly 204, which are disposed around the ion beam 104 so as to define an aperture 206 to transmit the ion beam 104. However, the embodiments are not limited in this context and cover variants in which coil assemblies include a greater number or lesser number of electromagnetic coils. The ion beam 104 is shown in cross-section having the shape of a ribbon ion beam, defined by a long axis L and short axis S, in which the long axis L extends parallel to the Xc direction. In one example, the width of the ion beam 104 along the long axis L is at least three times the height of the ion beam 104 along the short axis S. In the example of FIG. 2A, the upper coil assembly 202 and lower coil assembly 204 extend along the long axis L on either side of the ion beam 104. In some embodiments, the upper coil assembly 202 and lower coil assembly 204 may extend substantially parallel to the long axis L, such as within 5 degrees of parallel to the long axis L. In this manner, the aperture 206 may have a substantially constant dimension along the Y direction at different points along the Xc direction.

As shown in FIG. 2B an electromagnetic coil of the coil assembly 112 includes an inner portion 208 that may be composed of steel or similar material, and outer portion 210, which is arranged as a coil wrapped around the inner portion 208. Returning again to FIG. 2A, when the current source assembly 124 sends a current signal to the electromagnetic coils of coil assembly 112, the current source assembly 124 generates a magnetic field. In various embodiments the magnetic field generated by the coil assembly 112 forms a non-zero angle with respect to the direction of propagation of the ion beam 104, which is along the Zc-axis. Thus, the magnetic field may exert a force that provides deflection of ion trajectories within the ion beam 104. In particular embodiments, the magnetic field generated by the coil assembly 112 lies parallel to the Y-axis, that is, lies perpendicular to the direction of propagation of the ion beam 104, which is along the Zc-axis. When a constant current is provided to the coil assembly 112 a constant magnetic field (not shown) may be generated that exerts a constant force on charged particles traveling along the Zc-axis, which force acts largely along the Xc axis. However, in the present embodiments, a dithering current signal may be provided by the current source assembly 124 that generates a time-dependent magnetic field, as detailed below. In brief, a dithering current signal may be a time varying current that is characterized by a waveform.

In various embodiments, the current source assembly 124 may include multiple current sources (not shown) in which a given coil, such as electromagnetic coil 112a, is coupled to a current source to receive current independently of other electromagnetic coils. In some embodiments, each electromagnetic coil of coil assembly 112 may receive current independently of each other electromagnetic coil. In this manner, the electromagnetic coils may be driven individually or in concert with one another depending upon the current signals generated by current source assembly 124. An example of driving electromagnetic coils of the coil assembly 112 in concert involves sending the same dither current signal to all the electromagnetic coils, which may generate a time-dependent magnetic dipole field that generates a dither of the ion beam 104 along the X-axis. In other examples, a dither current signal may be provided to the coil assembly 112 to generate a time varying quadrupole field. On the other hand, a dither current signal may be sent to electromagnetic coil 112a that differs from current signals sent to other electromagnetic coils of the coil assembly 112, which may create a local dither of the ion beam 104 proximate to the electromagnetic coil 112a.

In particular embodiments, the controller 122 may control the current source assembly 124 to send a select dither current signal to a single electromagnetic coil, such as electromagnetic coil 112e, while static current is sent to the other electromagnetic coils of coil assembly 112. In this example the ion beam 104 experiences a local dither in a region that is proximate to the electromagnetic coil 112e, while other parts of the ion beam 104 may pass through the coil assembly 112 experiencing just a static magnetic field. However, the embodiments are not limited in this context.

In additional embodiments, instead of a pair of upper coil assembly and lower coil assembly, a coil assembly to dither an ion beam may comprise a single coil assembly located on one side of an ion beam and similar to the upper coil assembly 202 or lower coil assembly 204, without a corresponding coil located on the other side of the ion beam.

Figure 3A:
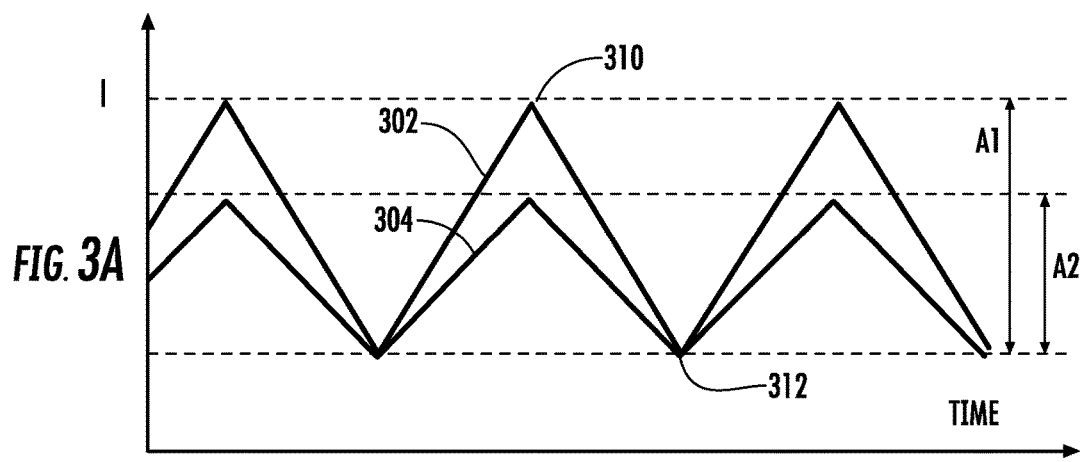
FIG. 3A-3C depict exemplary current signals for controlling an ion beam.

In further embodiments, different dither signals that vary in at least one respect may be provided to different electromagnetic coils of a coil assembly. FIG. 3A depicts exemplary dither current signals that may be sent to a coil assembly according to some embodiments. In various embodiments a dithering current may be provided at a frequency of 1 Hz to 1000 Hz. However, the embodiments are not limited in this context.

The current signal 302 may be provided to a first electromagnetic coil or a first group of electromagnetic coils. As illustrated, a dither current signal shown as the current signal 302 has a first amplitude, which is shown as A1. A dither current signal that is shown as a current signal 304 in FIG. 3A may be provided to a second electromagnetic coil or a second group of electromagnetic coils. As illustrated, the current signal 304 has a second amplitude, which is shown as A2 and is less than A1. Referring also to FIG. 2A, in one scenario, the current signal 302 may be provided to a portion of an ion beam, such as ion beam 104, where that portion is to receive a relatively greater perturbation by a dither magnetic field than other portions of the ion beam. For example, the outer regions of the ion beam 104 may need a greater dither, in which case, the current signal 302 may be sent to electromagnetic coil 112a, electromagnetic coil 112b, electromagnetic coil 112h, electromagnetic coil 112i, electromagnetic coil 112j, electromagnetic coil 112k, electromagnetic coil 112q, and electromagnetic coil 112r. The inner portion of the ion beam 104 may be determined to receive a lesser dither in which case the current signal 304 may be sent to the electromagnetic coil 112e and electromagnetic coil 112n, for example.

Figure 3B:
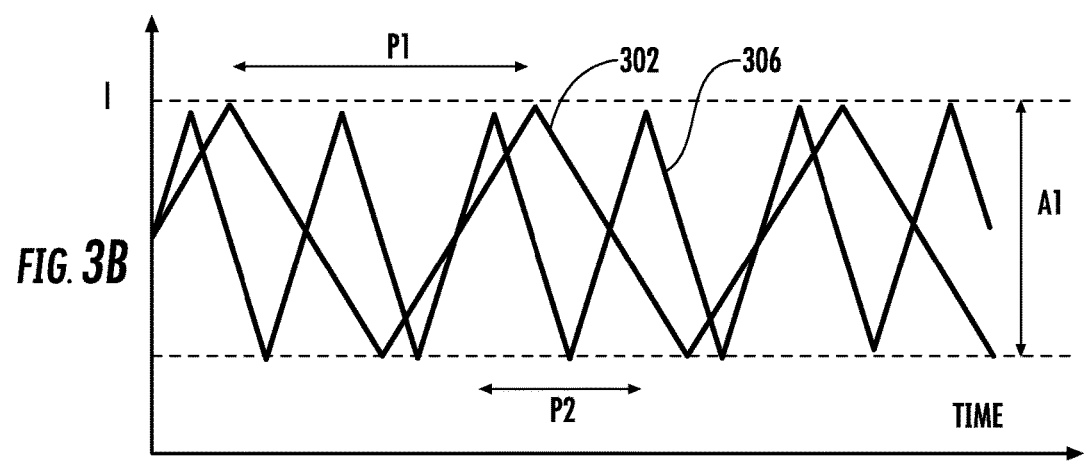

In other scenarios, it may be desirable to change the frequency of a dither current signal provided to a coil assembly in order to more rapidly or more slowly dither the ion beam, depending upon the circumstances. For example, a slowly varying non-uniformity that is detected by the beam monitor 120 may trigger a relatively lower frequency dither current signal (slow dither current signal), than a more rapidly varying non-uniformity, which may trigger a relatively higher frequency dither current signal (fast dither current signal). In some scenarios different dither current signals having different frequencies may be applied simultaneously to different parts of an ion beam, such as ion beam 104 For example, referring also to FIG. 3B, the outer regions of the ion beam 104 may need a slower dither, in which case, the current signal 302 may be sent to electromagnetic coil 112a, electromagnetic coil 112b, electromagnetic coil 112h, electromagnetic coil 112i, electromagnetic coil 112j, electromagnetic coil 112k, electromagnetic coil 112q, and electromagnetic coil 112r. On the other hand the inner portion of the ion beam 104 may be determined to receive a faster dither. As illustrated in FIG. 3B a current signal 306 is shown that has a period P2 that is less than the period P1 for current signal 302. Accordingly, the current signal 306 has a higher frequency, in which case the current signal 304 may be sent to the electromagnetic coil 112e and electromagnetic coil 112n, for example.

Figure 3C:
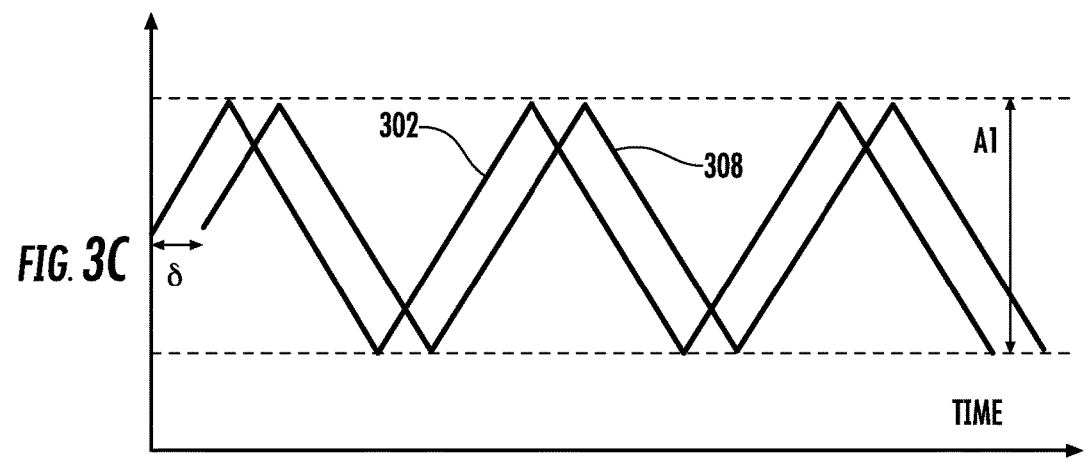

In other examples two different dither signals may be provided to different electromagnetic coils of a coil assembly, in which the two different dither signals have a phase offset from one another. This may allow finer control over beam dithering that is produced by the resulting dither magnetic field. FIG. 3C depicts an example in which a current signal 308 is provided with a phase offset with respect to the current signal 302.

It will be apparent that other combinations of dither current signals may be provided to a coil assembly that involve combinations of variations in amplitude, frequency and phase offset among the dither current signals that are distributed among different electromagnetic coils.

It is further to be noted that the amount of current variation in a dither current signal, that is, the dither current amplitude, may be just a fraction of a current that is provided to an electromagnetic coil. For example, the amplitude A1 may represent 5% 10% or 20%, 50% or 100% of a total current supplied to a given electromagnetic coil. Referring again to FIG. 3A, in further embodiments a dither current signal may be such that current direction reverses between a peak 310 and opposite peak 312 of a current signal 302. It is to be noted that magnetic field strength and coil current may vary substantially depending upon coil position, coil geometry, and ion beam parameters. In some examples, coil current may range from one amp to several tens of amps, and resultant magnetic field strength may vary between 10 and 1000 Gauss. However, the embodiments are not limited in this context.

In addition, although the embodiments of FIGS. 3A to 3C show triangular waveforms, in other embodiments the waveforms of a dither current signal may have other known shapes. The embodiments are not limited in this context.

Figure 4:
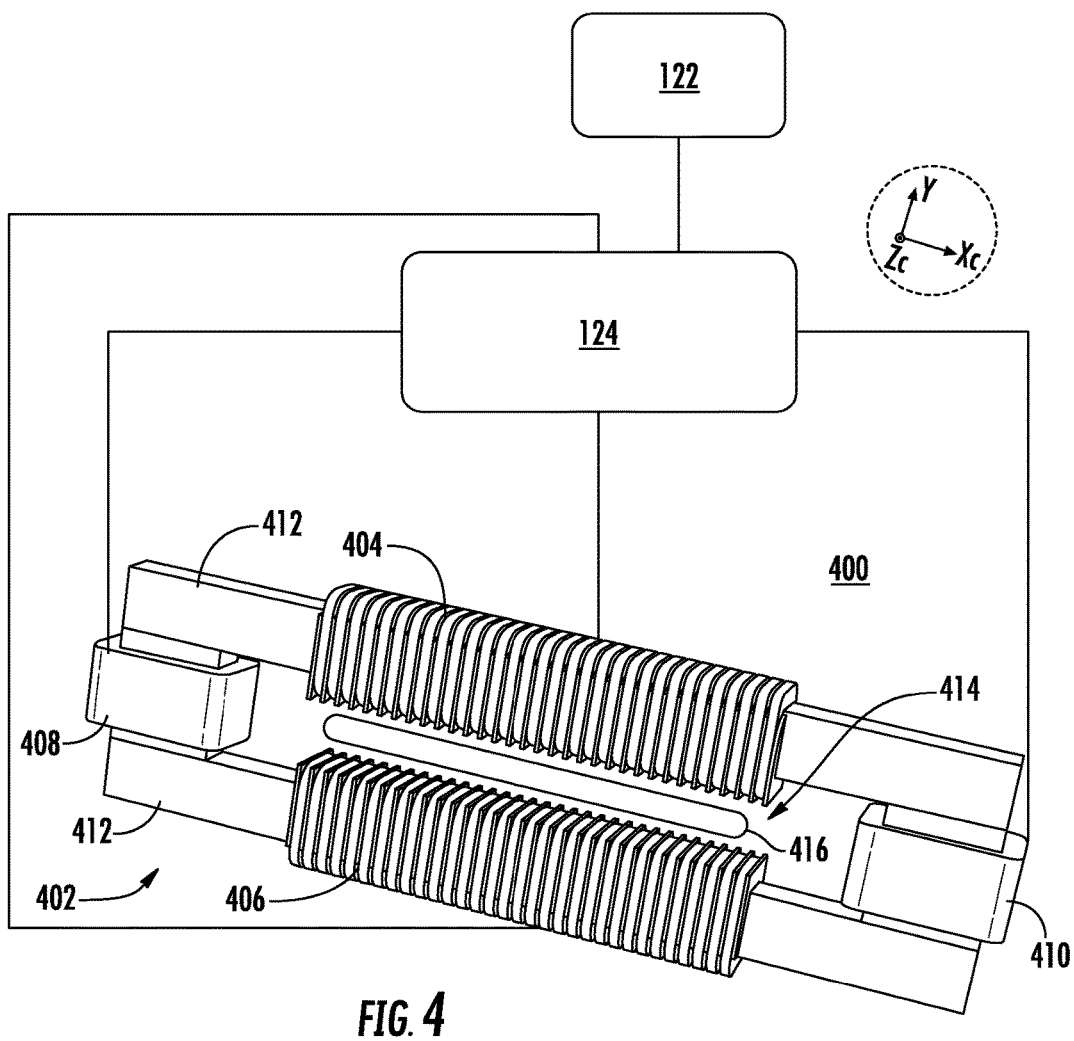
FIG. 4 depicts another exemplary apparatus to control a ribbon beam.

In additional embodiments, a multi-coil assembly may be composed of multiple electromagnetic coils that are wound around a common conducting bar. FIG. 4 illustrates an apparatus 400 that includes a multi-coil assembly having such a structure. The coil assembly 402 includes an upper coil assembly 404 and lower coil assembly 406. Although not separately shown, the upper coil assembly 404 and lower coil assembly 406 may each be composed of a plurality of electromagnetic coils, such as 10, coils, 20 coils, and so forth, and need not be symmetric left to right or top to bottom or even from one coil to the next. The coils of coil assembly 402 are wound around a member 412, which may be solid steel or laminated steel in different embodiments. The coil assembly defines an elongated aperture 414 through which an ion beam may pass, as described above with respect to FIGS. 2A and 2B. The coil assembly 402 also includes a first side coil 408 adjacent a first short side of the elongated aperture 414 and second side coil 410 disposed opposite the first side coil 408 along a second short side of the elongated aperture 414.

The current source assembly 124 may be coupled to the upper coil assembly 404, lower coil assembly 406, first side coil 408 and second side coil 410. Although not explicitly illustrated in FIG. 4, the current source assembly 124 may be composed of a plurality of current sources in which a given current source provides current individually to a select coil of the upper coil assembly 404 or lower coil assembly 406. The coil assembly 402 may be configured to operate in various different operating modes. For example, upper coil assembly 404 or lower coil assembly 406 may be provided current that flows in a common direction to produce a magnetic dipole. A non-varying dipole magnetic field may be produced in some examples, while a time varying dipole magnetic field may be produced in other examples. The upper coil assembly 404 or lower coil assembly 406 may each be provided dither current signals that are synchronized to one another to achieve a uniform dither of an ion beam 416 traveling through the elongated aperture 414. A suitable dipole field may also be produced by driving current through the first side coil 408 and second side coil 410. In other examples, a non-uniform dithering magnetic field may be applied perpendicularly to the direction of propagation of the ion beam 416.

In additional embodiments the conductive material of the member 412 may be removed from the side portions where the first side coil 408 and second side coil 410 are disposed in FIG. 4. In these embodiments, two separate bars are formed that each support a respective upper coil assembly or lower coil assembly. Such a configuration may generate a dithering magnetic field whose magnitude is reduced in comparison to that generated by the embodiment of FIG. 4.

It is to be noted that in the embodiments illustrated in FIGS. 1 to 4, an ion beam is conducted through evacuated chambers while the coil assemblies may, but need not, reside in ambient conditions. In such cases, a beam guide may be disposed between an ion beam and coil assembly, which may separate the coil assembly from the ion beam to preserve vacuum as the ion beam is conducted through the coil assembly.

Figure 5:
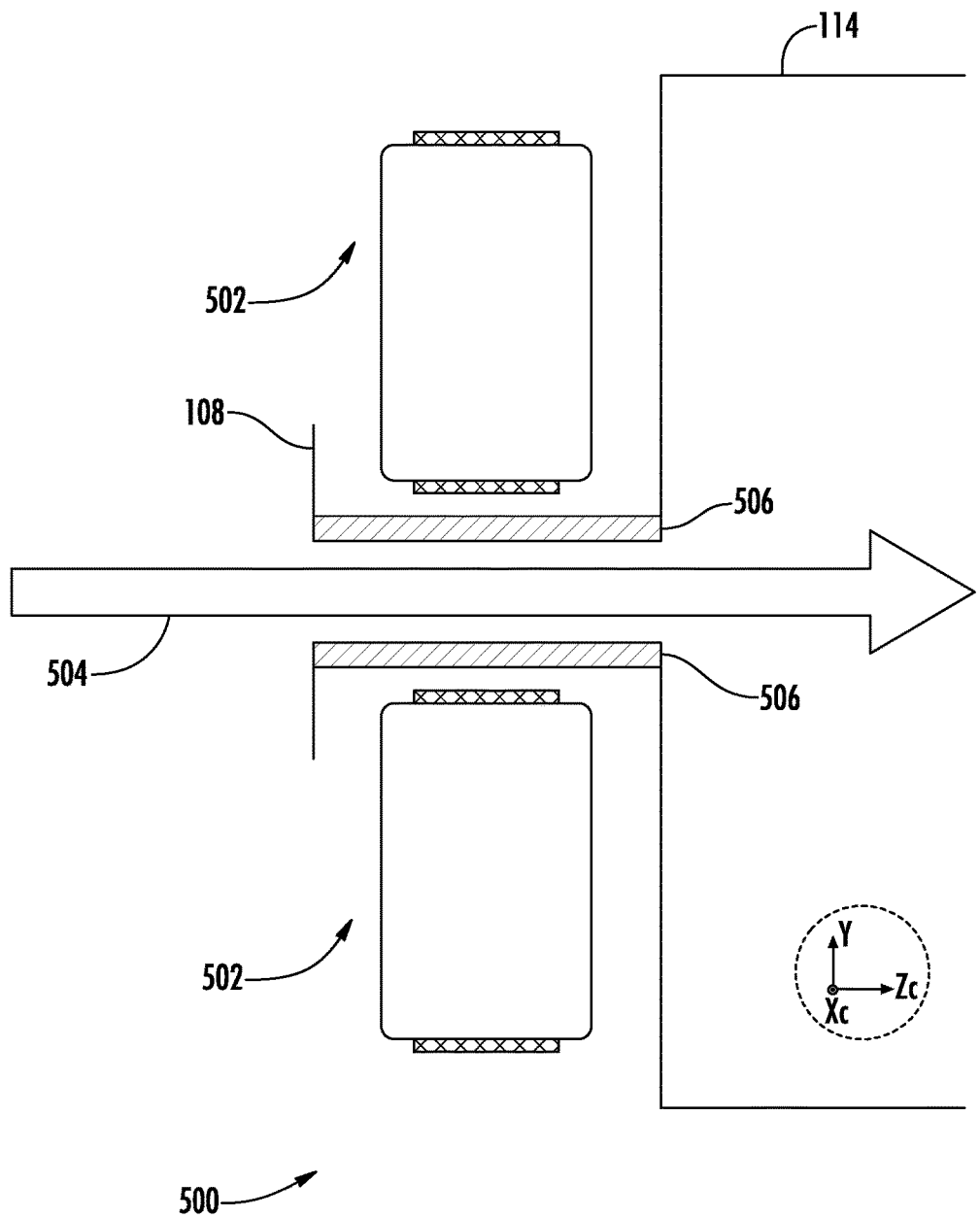
FIG. 5 depicts a side view of an exemplary coil assembly and beam guide.

One potential side effect during a dithering operation performed by a coil assembly is the introduction of eddy currents, which may be induced into nearby conductors, such as wave guides (beam guides) or graphite sheets. The eddy currents within a coil assembly itself may be reduced to a low level by the use of laminated steel (transformer steel). However eddy currents may still be induced in a conductive beam guide. FIG. 5 depicts a side view of an exemplary coil assembly and beam guide that addresses this issue. In FIG. 5 a coil assembly 502 is disposed on top and bottom of a ribbon beam 504 in a manner described above with respect to FIGS. 2A and 2B. A beam guide 506 is disposed between the coil assembly 502 and ribbon beam 504. However, in this embodiment, the beam guide 506 is composed of an electrically insulating material, such as quartz, in which no eddy currents are induced. In alternative embodiments, a conductive beam guide such as a metal beam guide may be provided with an insulating break that serves to break up eddy current formation. In further embodiments, a coil assembly may be disposed within vacuum such that no beam guide is located between the coil assembly and ion beam.

In addition, the frequency of dithering of a dither current signal may be reduced to a level in which eddy current formation is reduced or eliminated. For example if dither frequency is maintained below 100 Hz, eddy current formation may be largely avoided.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. An apparatus to control a ribbon ion beam, comprising:
a coil assembly comprising a plurality of electromagnetic coils configured to generate a magnetic field proximate the ribbon beam, the magnetic field extending in a first direction that forms a non-zero angle with respect to a direction of propagation of the ribbon ion beam;
a current source assembly configured to supply current to the coil assembly; and
a controller configured to control the current source assembly to send a plurality of dithering current signals to the coil assembly responsive to a beam current measurement of the ribbon ion beam, wherein the plurality of dithering current signals generate a fluctuation in magnetic field strength of the magnetic field, wherein a first dithering current signal applied to a first electromagnetic coil varies in at least one respect from a second dithering current signal applied to a second electromagnetic coil of the coil assembly, wherein the current source assembly comprises a plurality of current sources that are configured to individually supply current to the respective plurality of electromagnetic coils, wherein the controller is configured to direct the current source assembly to supply the first dithering current signal as a first time varying current defined by a first waveform to a first electromagnetic coil of the coil assembly, and to direct the current source assembly to simultaneously supply the second dithering current signal as a second time varying current defined by a second waveform to a second electromagnetic coil of the coil assembly, wherein the first dithering current signal is a leading dithering current signal, and wherein the second dithering current signal is a lagging dithering current signal that exhibits a phase lag with respect to the leading dithering current signal.

2. The apparatus of claim 1, wherein the controller is configured to direct the current source assembly to supply a fast dither current signal having a first frequency to a first electromagnetic coil of the coil assembly, and to direct the current source assembly to supply a slow dither current signal having a second frequency less than the first frequency to a second electromagnetic coil of the coil assembly.

3. The apparatus of claim 1, wherein a frequency of the leading dithering current signal is equal to a frequency of the lagging dithering current signal.

4. The apparatus of claim 1, wherein the current source assembly is configured to supply dithering current to the coil assembly at a frequency of 1 Hz to 1000 Hz.

5. The apparatus of claim 1, wherein the current source assembly is configured to supply dithering current to the coil assembly at a frequency of less than 200 Hz.

6. The apparatus of claim 1,
wherein the ribbon beam comprises a cross section having a long axis and a short axis,
wherein the coil assembly comprises an upper coil assembly that includes a first plurality of electromagnetic coils and a lower coil assembly that includes a second plurality of electromagnetic coils, the upper coils assembly and lower coil assembly extending substantially parallel to the long axis and defining an elongated aperture to transmit the ribbon ion beam.

7. The apparatus of claim 6, further comprising a beam guide disposed between the upper coil assembly and lower coil assembly and comprising an electrically insulating material.

8. The apparatus of claim 6, wherein the coil assembly further comprising a first side coil adjacent a first short side of the elongated aperture and second side coil disposed opposite the first side coil along a second short side of the elongated aperture.

9. The apparatus of claim 1, wherein the at least one dithering current signal generates a time-dependent variation is beam current density.

10. The apparatus of claim 1, wherein the at least one dithering current signal generates a time varying dipole magnetic field or quadrupole field along the first direction.

11. An ion implanter, comprising:
an ion source to generate a ribbon ion beam;
a beam monitor to perform a beam current measurement of the ribbon ion beam at a first position;
a coil assembly comprising a multiplicity of coils configured to generate a magnetic field proximate the ribbon beam at a second position, the magnetic field extending in a first direction that that forms a non-zero angle with respect to a direction of propagation of the ribbon ion beam at the second position;
a current source assembly configured to supply a dithering current to the coil assembly; and
a controller configured to control the current source assembly to send a plurality of dithering current signals to the coil assembly responsive to the beam current measurement, wherein the plurality of dithering current signals generate a fluctuation in magnetic field strength of the magnetic field, wherein a first dithering current signal applied to a first electromagnetic coil varies in at least one respect from a second dithering current signal applied to a second electromagnetic coil of the coil assembly, wherein the current source assembly comprises a plurality of current sources that are configured to individually supply current to the respective plurality of electromagnetic coils, wherein the controller is configured to direct the current source assembly to supply the first dithering current signal as a first time varying current defined by a first waveform to a first electromagnetic coil of the coil assembly, and to direct the current source assembly to simultaneously supply the second dithering current signal as a second time varying current defined by a second waveform to a second electromagnetic coil of the coil assembly, wherein the first dithering current signal is a leading dithering current signal, and wherein the second dithering current signal is a lagging dithering current signal that exhibits a phase lag with respect to the leading dithering current signal.

12. The ion implanter of claim 11, wherein the at least one dithering current signal is configured to dither the ribbon ion beam to adjust for non-uniformity of the ribbon ion beam based upon the beam current measurement.

13. The ion implanter of claim 11,
wherein the beam monitor is configured to measure a first beam current profile at a first instance and a second beam current profile at a second instance,
wherein the controller is configured to control the current source assembly to send the first dithering current signal to the coil assembly responsive to first beam current profile and to send the second dithering current signal to the coil assembly responsive to second beam current profile,
wherein the controller adjusts the ribbon ion beam in real-time.

14. The ion implanter of claim 11, further comprising a substrate stage configured to scan a substrate along a direction parallel to the first direction at a substrate scan rate, wherein the controller is configured to control the current source assembly to generate the at least one dither current signal at a dither frequency that is configured to reduce beam current dose variation in the ribbon ion beam that is delivered to the substrate based upon the substrate scan rate and beam current variation detected in the beam current measurement.

15. The ion implanter of claim 11, wherein the controller is configured to operate the coil assembly in a plurality of operating modes, wherein in a first operating mode a non-varying dipole magnetic field is directed perpendicularly to the direction of propagation, wherein in a second operating mode a uniform dithering magnetic field is applied perpendicularly to the direction of propagation, and wherein in a third operating mode a non-uniform dithering magnetic field is applied perpendicularly to the direction of propagation, and wherein in a fourth operating mode, a quadrupole field is generated.

16. A method for controlling a ribbon ion beam, comprising:
measuring a beam current profile of the ribbon ion beam at a first position, the beam current profile comprising beam current density as a function of position along at least one direction that is perpendicular to a direction of propagation of the ribbon ion beam;
determining a non-uniformity in the ribbon ion beam based upon the beam current profile; and
sending a control signal to dither current within a plurality of electromagnetic coils of a coil assembly, the coil assembly being disposed around the ribbon beam at a second position, and configured to generate a magnetic field extending in a first direction that forms a non-zero angle with respect to a direction of propagation of the ribbon ion beam at the second position,
wherein the plurality of electromagnetic coils generate a fluctuating magnetic field that causes a time-dependent variation in beam current density in the ribbon ion beam, wherein a first dithering current signal applied to a first electromagnetic coil varies in at least one respect from a second dithering current signal applied to a second electromagnetic coil of the coil assembly, wherein the sending the control signal comprises sending the first dithering current signal a first time varying current defined by a first waveform to a first electromagnetic coil of the coil assembly, and simultaneously sending the second dithering current signal as a second time varying current defined by a second waveform, wherein the first dithering current signal is a leading dithering current signal, and wherein the second dithering current signal is a lagging dithering current signal that exhibits a phase lag with respect to the leading dithering current signal.

17. The method of claim 16, wherein the control signal comprises a signal to generate the first dithering current signal and second dithering current signal, wherein the second dithering current signal differs from the first dithering current signal in at least one of: amplitude and frequency.

* * * * *